United States Patent
Xu et al.

(10) Patent No.: US 10,082,519 B2
(45) Date of Patent: Sep. 25, 2018

(54) BERRY IMPACT RECORDING DEVICE

(71) Applicant: University of Georgia Research Foundation, Inc., Athens, GA (US)

(72) Inventors: Rui Xu, Athens, GA (US); Changying Li, Watkinsville, GA (US)

(73) Assignee: University of Georgia Research Foundation, Inc., Athens, GA (US)

(*) Notice: Subject to any disclaimer, the term of this patent is extended or adjusted under 35 U.S.C. 154(b) by 0 days.

(21) Appl. No.: 15/804,710

(22) Filed: Nov. 6, 2017

(65) Prior Publication Data

US 2018/0059133 A1    Mar. 1, 2018

Related U.S. Application Data

(63) Continuation-in-part of application No. 14/802,253, filed on Jul. 17, 2015.

(60) Provisional application No. 62/026,255, filed on Jul. 18, 2014.

(51) Int. Cl.
| | |
|---|---|
| *G01P 1/12* | (2006.01) |
| *H05K 5/00* | (2006.01) |
| *A01D 46/24* | (2006.01) |
| *H04N 5/232* | (2006.01) |

(52) U.S. Cl.
CPC .............. *G01P 1/127* (2013.01); *A01D 46/24* (2013.01); *H05K 5/0095* (2013.01); *H04N 5/23203* (2013.01)

(58) Field of Classification Search
CPC ................................. G01P 1/127; A01D 46/24
USPC ........................................... 56/328.1; 702/41
See application file for complete search history.

(56) References Cited

U.S. PATENT DOCUMENTS

| | | | | |
|---|---|---|---|---|
| 6,125,686 | A * | 10/2000 | Haan ....................... | G01P 1/127 73/12.04 |
| 6,442,920 | B1 * | 9/2002 | Peterson ................. | A01D 46/26 56/328.1 |
| 7,450,332 | B2 * | 11/2008 | Pasolini ................ | G01P 15/0891 360/69 |
| 2010/0191356 | A1 * | 7/2010 | Wehrenberg .......... | G06F 1/1616 700/94 |
| 2014/0250854 | A1 * | 9/2014 | Wendte ................... | A01D 46/28 56/340.1 |
| 2015/0278719 | A1 * | 10/2015 | Schueller ............. | G06Q 10/063 705/7.11 |
| 2016/0018431 | A1 * | 1/2016 | Xu .......................... | G01P 1/127 702/41 |

* cited by examiner

*Primary Examiner* — Caleb Henry
(74) *Attorney, Agent, or Firm* — Thomas Horstemeyer, LLP (57) ABSTRACT

Disclosed are various embodiments for a berry impact recording device. The berry impact recording device comprises a shell. Within the shell are at least a sensor and an integrated circuit. The sensor may be configured to detect an acceleration of the berry impact recording device. The integrated circuit may be configured to record the acceleration of the berry impact recording device and a timestamp corresponding to the acceleration.

20 Claims, 6 Drawing Sheets

BERRY IMPACT RECORDING DEVICE

CROSS REFERENCE TO RELATED APPLICATIONS

This application is a continuation in part of U.S. patent application Ser. No. 14/802,253, filed on Jul. 17, 2015, which claims priority to, and the benefit of, U.S. Provisional Application No. 62/026,255, filed on Jul. 18, 2014, which is incorporated by reference as if set forth herein in its entirety.

STATEMENT REGARDING FEDERALLY SPONSORED RESEARCH OR DEVELOPMENT

This invention was made with government support under grant no. 2008-51180-19579 awarded by the U.S. Department of Agriculture. The government has certain rights in this invention.

BACKGROUND

Berries may be harvested from fields by hand or using mechanical harvesting and processing machines. However, the use of mechanical harvesting and processing machines results in a higher percentage of bruised and/or damaged berries as compared to harvesting and processing by hand. Mechanical harvesting and processing causes a large number of mechanical impacts to be inflicted upon berries in comparison to harvesting and processing by hand.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

Disclosed are various embodiments for a berry impact recording device. The berry impact recording device may measure the mechanical impact on various berries by mechanical harvesting and processing techniques. The berry impact recording device may, in various embodiments, use an accelerometer or a pressure sensor. A series of mechanical impacts may, in some embodiments, be recorded over a period of time. In the following discussion, a general description of the system and its components is provided, followed by a discussion of the operation of the same.

Figure 1:
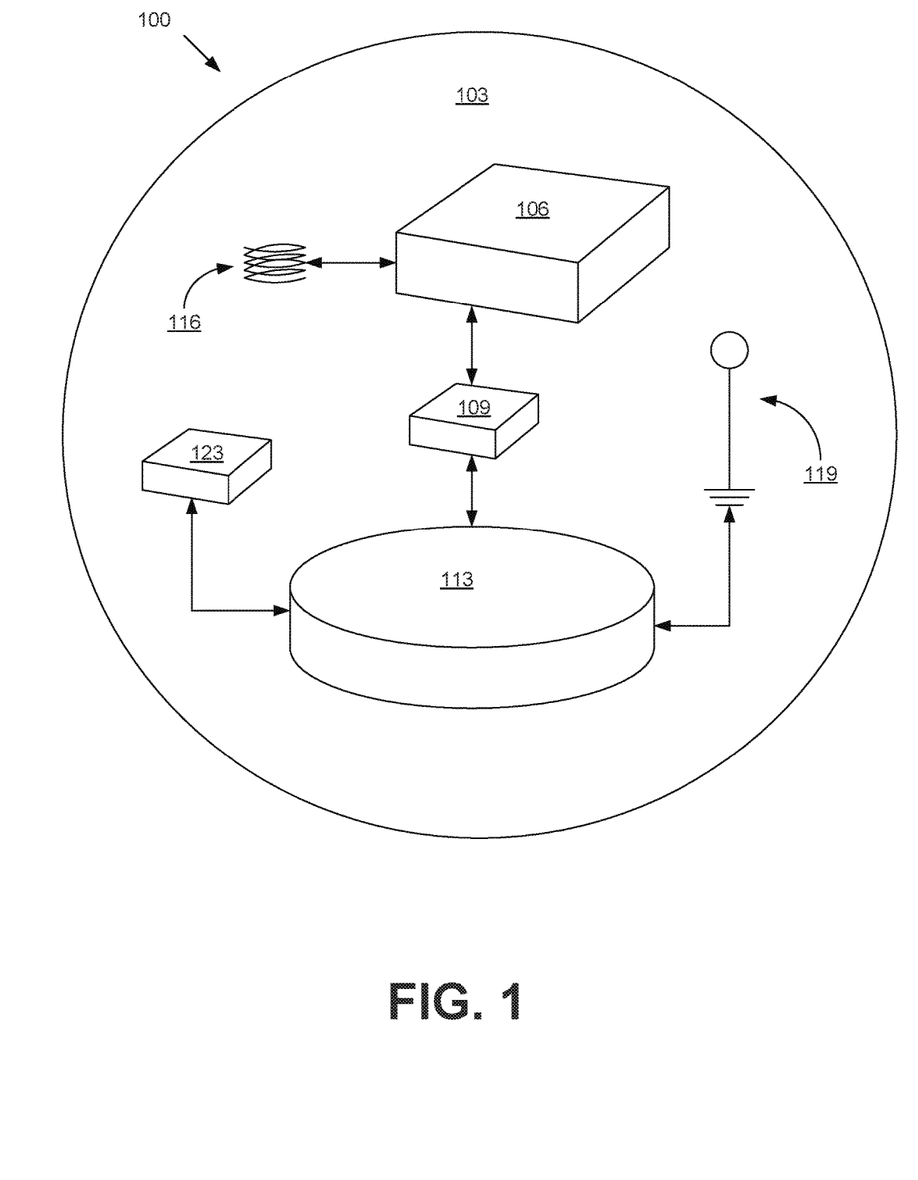
FIG. 1 is a schematic block diagram of berry impact recording device.

Beginning with FIG. 1, a berry impact recording device 100 is depicted according to various embodiments of the present disclosure. The berry impact recording device 100 includes an outer shell 103, a battery 106, a sensor 109, and a circuit board 113. In some embodiments, the berry impact recording device 100 can also include a charging circuit 116 that provides for inductive charging of the battery 106. In some embodiments, the berry impact recording device 100 can further include a radio communications interface 119 for wireless or radio network communications with other computing devices. Some embodiments can also include a geolocation circuit 123, which can be used to determine the current location of the berry impact recording device 100 at various points in time.

Generally, the berry impact recording device 100 is constructed to match the size, shape, and weight of the berry that is being processed. For example, if the berry impact recording device 100 is to be used to record impacts to blueberries during the processing of blueberries, the berry impact recording device 100 would be spherical in shape with a diameter no larger than 0.75 inches, which is approximately the diameter of a large blueberry. However, the berry impact recording device 100 may be shaped and sized to match other berries or fruits, such as strawberries, cherries, blackberries, raspberries, and/or other fruits.

The outer shell 103 may be formed from any suitable material of sufficient weight, strength, and durability to survive mechanical agricultural processes, house the remaining components of the berry impact recording device 100, and match the weight of the particular berry that the berry impact recording device 100 is designed to imitate. Example materials include rubber, silicone, rubberized silicone, rubberized plastic, resin, or other suitable materials.

In some embodiments, the outer shell 103 may be waterproof or otherwise resistant to penetration by liquids. For example, a waterproof outer shell 103 may be manufactured to lack any breaches in the exterior surface of the outer shell 103 that would allow water or other liquids to reach the components located within the outer shell 103. This may be achieved, for example, by placing the various components of the berry impact recording device 100 in a mold and filling the mold with rubber, rubberized plastic, silicone, rubberized silicone, resin, or other suitable materials.

The battery 106 may include any battery capable of providing sufficient power for the berry impact recording device 100 to operate through the mechanical harvesting and/or mechanical processing of berries. The battery 106 can supply power to one or more of the sensor 109, the circuit board 113, and the radio communications interface 119.

The sensor 109 may include any one or more of a number of sensors capable of measuring motion, acceleration, and/or impact data. The sensor 109 may include, for example, a microelectricomechanical systems (MEMS) gyroscope, a MEMS pressure sensor, and/or other MEMS sensors. In those embodiments that use a MEMS gyroscope to measure changes in acceleration of the berry impact recording device 100, the sensor 109 may be configured to measure changes in acceleration along the X-axis, Y-axis, and/or Z-axis. For example, in some embodiments, the berry impact recording device 100 may include a tri-axis accelerometer as the sensor 109 in order to minimize the size of the berry impact recording device 100 as compared to embodiments that use multiple sensors 109 to measure changes in acceleration along the X-axis, Y-axis, and Z-axis. Embodiments that use a single sensor 109 instead of multiple sensors 109 may allow the berry impact recording device 100 to be similar in size and weight to actual berries.

The circuit board 113 includes the control logic and electrical circuitry necessary for the operation of the berry impact recording device 100. The circuit board 113 may, for example, determine whether to record or store measurements provided by the sensor 109. The circuit board 113 may also, for example, determine when the sensor 109 is to make measurements. In some embodiments, the circuit board 113 may also implement one or more wireless charging protocols (e.g., the QI wireless charging protocol) to facilitate wireless charging of the battery 106 through the charging circuit 116. The circuit board 113 may also, in some embodiments, be configured to send data to another computing device or allow another computing device to retrieve data from the circuit board 113, such as sensor 109 readings and corresponding timestamps.

For example, the circuit board 113 may include a serial port interface that complies with the RS-232 standard for communication with external devices or a universal serial bus (USB) interface that complies with one or more versions of the USB standard for communication with external devices. Due to the small size of the berry impact recording device, some embodiments may use a USB interface that complies with the USB Mini-A, USB Mini-B, USB Mini-AB, USB Micro-A, USB Micro-B, USB Micro-AB, or USB Type C standard in order to minimize the size of the berry impact recording device. In these embodiments, the serial port interface or the USB interface may be externally accessible through a port or other opening in the outer shell 103.

Similarly, the circuit board 113 can include or be communicatively coupled with a radio communications interface 119, thereby allowing the berry impact recording device 100 to wirelessly send and receive data or instructions to or from a remote computing device. Such implementations may be used in order to avoid including a port in the outer shell 103 in order to maintain the waterproof properties of a waterproof outer shell 103. Although the radio communications interface 119 is depicted separately from the circuit board 113 in FIG. 1 for illustrative purposes, the radio communications interface 119 can be integrated into the circuit board 113, such as when the circuit board 113 is manufactured as a system-on-a-chip.

The circuit board 113 can also include an internal clock or other time-keeping circuit or mechanism. In some instances, the circuit board 113 will record the time, as measured by the clock, that the sensor 109 makes a measurement. The circuit board 113 can then cause the time to be stored in association with the measurement in order to record when the measurement was taken. This allows for individual measurements to be timestamped for future evaluation.

The radio communications interface 119 can include any network interface for wireless network communications. For example, the radio communications interface 119 can include a cellular network interface, a wireless network interface that complies with or implements one or more versions of the BLUETOOTH® protocol, a wireless network interface that complies with or implements one or more versions of the IEEE 802.11 protocol (e.g., "WI-FI"), or other similar protocol. In some embodiments, the radio communications interface 119 can implement multiple protocols (e.g., BLUETOOTH and WI-FI) or may include multiple interfaces, each of which implements a specific wireless communications protocol.

The charging circuit 116 for inductive charging of the battery 103 can include various suitable circuits. For example, the charging circuit 116 can include an inductor such as a coil or reactor. As another example, the charging circuit 116 can include an LC circuit, such as a resonant circuit, a tank circuit, or a tuned circuit.

The circuit board 113 can include or be communicatively coupled with a geolocation circuit 123. The geolocation circuit 123 can include one or more circuits for determining the location of the berry impact recording device 100 at various points in time. The geolocation circuit 123 may be configured to calculate the position of the berry impact recording device 100 based on various signals received by the geolocation circuit 123, such as satellite signals, signals from nearby radio or cellular transmission towers, or other sources. Examples of geolocation circuits 123 include global positioning system (GPS) and global navigation satellite system (GLONASS) receivers. Although the geolocation circuit 123 is illustrated in FIG. 1 as a separate component, the geolocation circuit 123 can be integrated into the circuit board 113 in some embodiments, such as when the circuit board 113 is manufactured as a system-on-a-chip.

However, in case of the absence of satellite signals when using the berry impact recording device 100, such as when the berry impact recording device 100 is used inside some buildings, other indoor positioning systems may be used to locate the berry impact recording device 100 using the radio communications interface 119. These systems may use multiple radio receivers to track the current position of the berry impact recording device 100 by detecting the time difference in receiving the radio signal emitted by the radio communications interface 119. Examples of indoor positioning systems using these approaches include Wi-Fi positioning systems, iBeacone, and ultra-wideband positioning systems.

Figure 2:
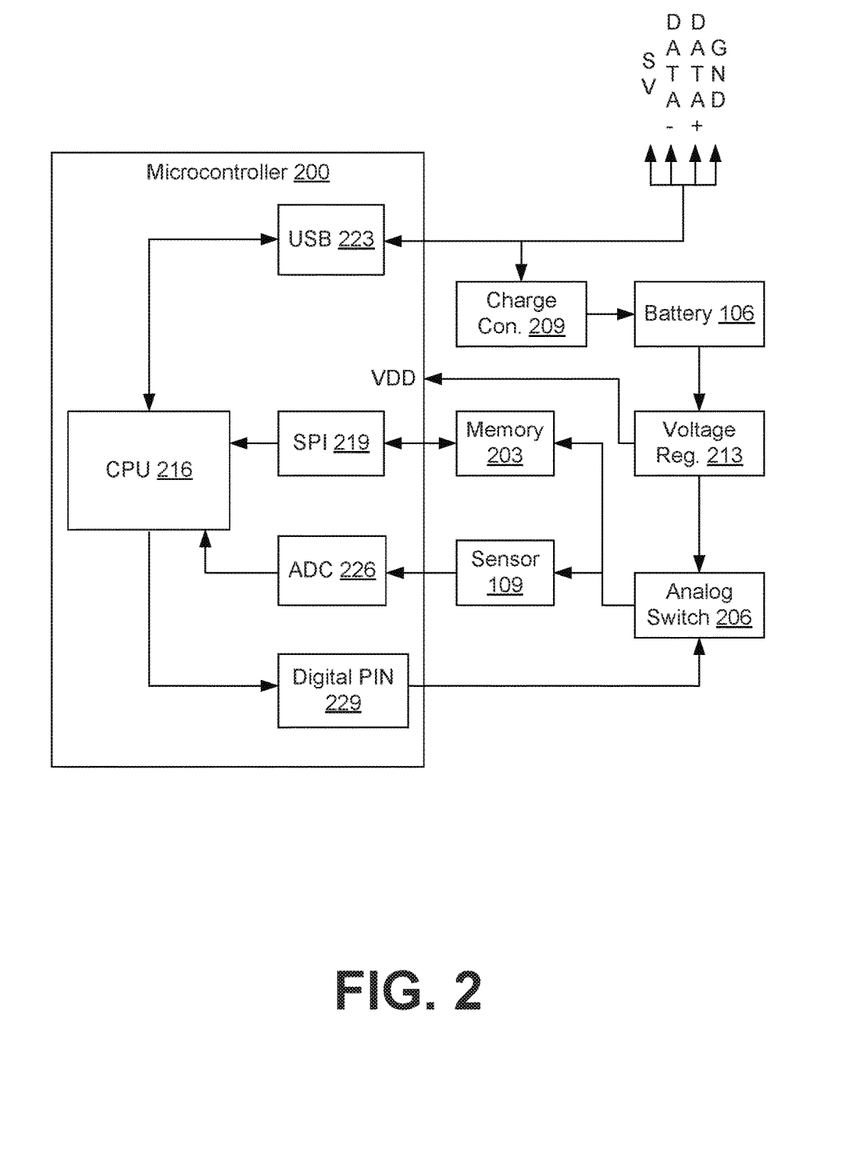
FIG. 2 is a schematic block diagram of the circuit board of the berry impact recording device depicted in FIG. 1.

Proceeding to FIG. 2, depicted is circuit diagram detailing the electrical connections of the components of a berry impact recording device 100. Shown are a microcontroller 200, a memory 203, an analog switch 206, a charge controller 209, a voltage regulator 213, a battery 106, and a sensor 109. The microcontroller 200, memory 203, analog switch 206, charge controller 209 and/or regulator 213 may be components of the circuit board 113 (FIG. 1) in some embodiments of the present disclosure.

The microcontroller 200 may be selected for reasonably fast operation speed, low power consumption, and a small package size sufficient to fit into a volume equivalent to that of a common berry and leave room remaining for other components of the berry impact recording device 100. The microcontroller 200 may include a number of components, such as a central processing unit (CPU) 216 to execute software instructions, a serial port controller that provides communications via a serial port, and/or a universal serial bus (USB) controller that provides via a USB port. The serial port controller or the USB controller may be electrically and/or communicatively coupled to a serial peripheral interface (SPI) 219 or a USB interface 223 on the circuit board 113 in order for the microcontroller 200 to communicate with external devices or peripherals. In some embodiments, the microcontroller 200 may be electrically or communicatively coupled to the radio communications interface 119 (FIG. 1) in order for the microcontroller 200 to communicate with external devices or peripherals. Likewise, the microcontroller 200 may also be electrically or communicatively coupled to the geolocation circuit 119 (FIG. 1) in order for the microcontroller 200 to communicate with the geolocation circuit 119 in order to retrieve the current position of the geolocation circuit 119. The microcontroller 200 can also include an analog-to-digital converter 226 (ADC) to convert analog readings from the sensor 109 into a digital form that can be processed by the CPU 216. In some instances, the microcontroller 200 can also include a digital PIN 229 to allow the CPU 216 to send command or state information to the analog switch 206, such as a command to turn on or off. CPU 216 may also be configured to execute any logical functions necessary for the functionality of the berry impact recording device 100 as may be further described herein.

The memory 203 may include any suitable memory. Common criteria may include fast write speeds, low power consumption, high density, and a long life cycle. For example, NAND and/or NOR flash memory, as well Ferroelectric Random-Access Memory (F-RAM) may be used. Other types of non-volatile memory, such as Electrically Erasable Programmable Read-Only Memory (EEPROM) may be unsuitable for use in a berry impact recording device 100 due to slow write speeds and/or short life cycles as a result of an unacceptably low number of mean read-write cycles between failures.

The analog switch 206 allows for turning the berry impact recording device 100 on or off. When set to the off position, the analog switch 206 is set in a position that breaks the circuit and, therefore, the flow of electric current through the berry impact recording device 100. When set to the on position, the analog switch is set in a position that completes the circuit and, therefore, permitting the unimpeded flow of electric current through the system.

The charge controller 209 accepts an external electrical current and uses it to charge the battery 106. For example, the charge controller 209 may be coupled to or include a universal serial bus (USB) port or a direct current power input. As another example, the charge controller 209 may be coupled to or include the charge circuit 116 (FIG. 1) in embodiments that implement wireless charging. In such embodiments, the charge controller 209 may convert an alternating current voltage generated by the charge circuit 116 into a direct current voltage that can be used to charge the batter 106. The charge controller 209 then uses the received current to recharge the battery 106. The charge controller 209 may also be configured to prevent the battery 106 from overcharging or from discharging too rapidly (or not rapidly enough). If connected to a charge circuit 116, the charge controller 209 may also include or implement the necessary logic required to comply with a wireless charging protocol, such as the QI protocol.

The voltage regulator 213 regulates the voltage of the electrical current provided by the battery 106. For example, the voltage regulator 213 may increase or decrease the voltage of the electric current supplied by the battery 106 to match the voltage necessary for the operation of other components, such as the microcontroller 200, memory 203, analog switch 206, charge controller 209, and/or sensor 109.

Next, a general description of the berry impact recording device 100 is provided. Some functions are discussed in further detail in FIGS. 3-6. However, the omission of a discussion of a particular function in further detail from FIGS. 3-6 is not intended limit the scope of the various embodiments of the present disclosure.

To begin, the berry impact recording device 100 is communicatively connected to a computing device. This could include a Wi-Fi or BLUETOOTH connection to a client application executing on a personal computer (e.g., desktop, laptop, workstation, etc.), a mobile device (e.g., a smartphone, a tablet, etc.), or other computing device. The client application is then used to configure the berry impact recording device 100. This can include changing how frequently the berry impact recording device 100 is to sample readings from the sensor 109, setting the correct date and time on the berry impact recording device 100, setting a threshold level for storing sensor 109 readings, or configuring other settings.

The berry impact recording device 100 is then placed in the processing equipment and moves through the processing equipment as if it were another item of produce. The processing equipment may include sorters, washers, packers, and other equipment used to sort, process, and package produce. In some instances, an image capture device (e.g., a video camera, a photographic camera, or other device) may capture video or periodically capture still photographs of the processing equipment. After the berry impact recording device 100 has moved through the processing equipment, the berry impact recording device 100 is then retrieved.

The berry impact recording device 100 can then be reconnected to the client application. The client application can then be used to retrieve the data recorded or collected by the berry impact recording device 100 for further analysis. For example, the timestamps of the individual sensor 109 readings could be correlated to corresponding still frames of video or photographs taken at the same or a similar time of the individual sensor 109 reading.

In some instances, however, the berry impact recording device 100 may remain connected to the client application. For example, if the berry impact recording device 100 is in constant BLUETOOTH range of the computing device or if the berry impact recording device 100 has a constant or consistent Wi-Fi or cellular connection, berry impact recording device 100 may remain communicatively connected to the client application. In these instances, the berry impact recording device 100 can provide real-time or near real-time reporting of sensor 109 readings as they are sampled.

In other instances, the berry impact recording device 100 may cause the image capture device to record an image whenever a sensor 109 reading is recorded. For example, the berry impact recording device 100 can be configured to only record a sensor 109 reading if the value is above a certain threshold. For example, the acceleration or pressure sampled from the sensor 109 may only be recorded if the value is above a configured threshold. In these instances, the berry impact recording device 100 may also be configured to send a command to the image capture device to record an image of the processing equipment in order to ensure that an image of the event that generated the sensor 109 reading is recorded.

Moreover, the berry impact recording device 100 can be configured to broadcast its current location. Due to the small size of the berry impact recording device 100, it is not uncommon for the berry impact recording device 100 to get lost while it is still in network or data communication with the client application (or otherwise communicatively coupled to the client application). In these instances, the berry impact recording device 100 can be configured with the client application to identify its current location using the geolocation circuit 123 and report its current location to the client application to assist in locating the berry impact recording device 100.

In instances where the geolocation circuit 123 is unable to determine the position of the berry impact recording device 100 (e.g., inside a building with limited reception to GPS or GLONASS signals), other approaches can be used. As previously noted, various indoor location services may use the time delay on arrival of radio communications received from the radio communications interface 119 to determine the position of the berry impact recording device 100.

Figure 3:
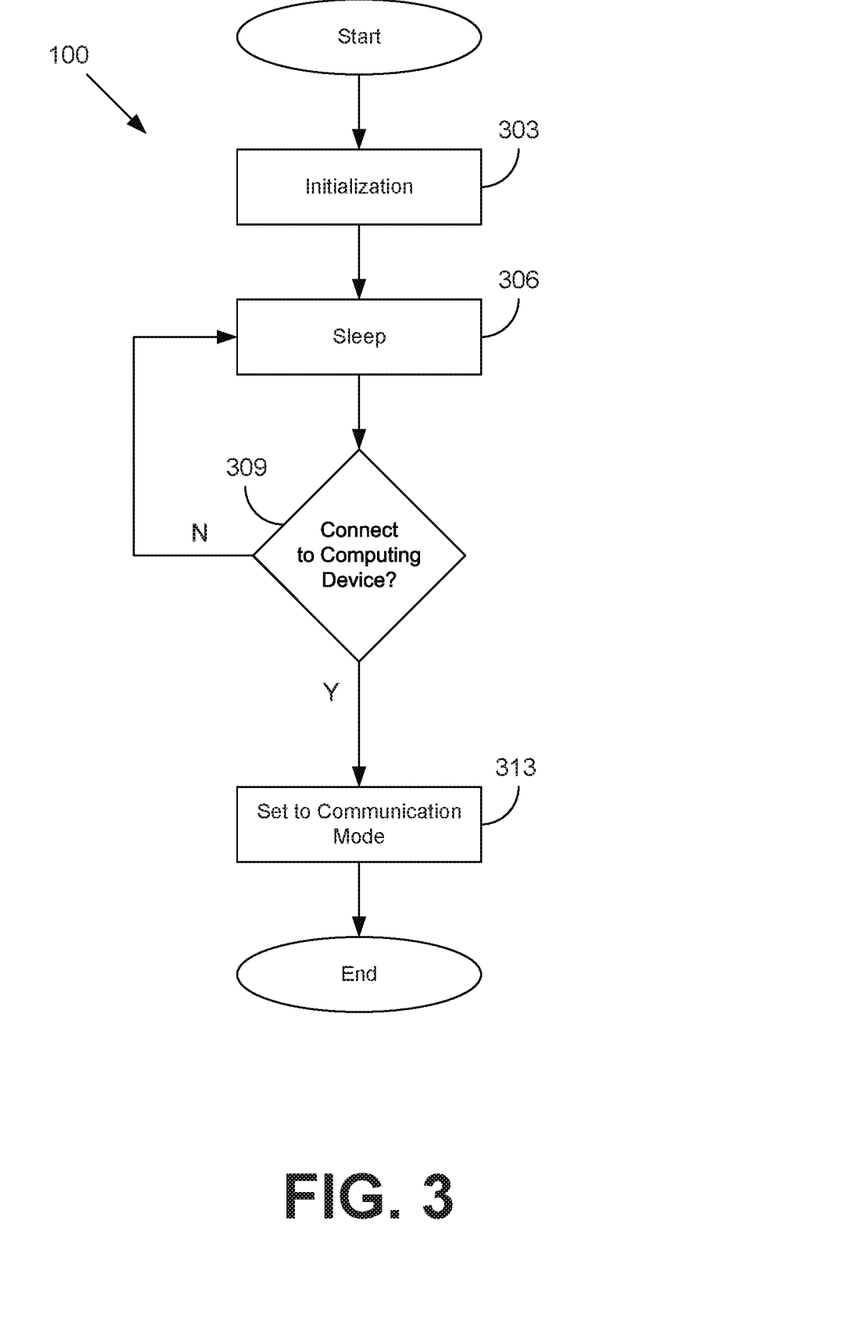
FIG. 3 is a flowchart illustrating one example of functionality implemented within the circuit board of the berry impact recording device depicted in FIG. 1 according to various embodiments of the present disclosure.

Referring next to FIG. 3, shown is a flowchart that provides one example of the operation of a portion of the berry impact recording device 100 while in sleep mode according to various embodiments. It is understood that the flowchart of FIG. 3 provides merely an example of the many different types of functional arrangements that may be employed to implement the operation of the portion of the berry impact recording device 100 as described herein. As an alternative, the flowchart of FIG. 3 may be viewed as depicting an example of elements of a method implemented in the berry impact recording device 100 according to one or more embodiments.

Beginning with box 303, the berry impact recording device 100 is turned on. In response, the microcontroller 200 performs various initialization functions. These initialization functions may include a power-on self-test (POST) for each of the components of berry impact recording device 100. The microcontroller 200 (FIG. 2) may also set the values for the various hardware and software components to default values or to the last known value as saved in the memory 203 (FIG. 2).

Moving on to box 306, the berry impact recording device 100 enters a sleep state. To enter the sleep state, the microcontroller 200 may signal the sensor 109 (FIG. 1) and/or the memory 203 to power off. The microcontroller 200 may then enter a suspended operation mode, in which the microcontroller 200 may only respond to external interrupts. As a result, the power drain on the battery 106 (FIG. 1) may be minimized.

Proceeding to box 309, the microcontroller 200 determines whether an external interrupt received corresponds to an indication that the berry impact recording device 100 has been connected to a computing device, such as a desktop computer, laptop computer, smartphone, tablet computer, or other computing device. For example, the USB controller of the microcontroller 200 may detect that a computing device has been attached to the USB interface of the circuit board 113 as a result of a signal received from the USB interface by the microcontroller 200. As another example, the microcontroller 200 may receive a signal from the radio communications interface 119 indicating that a message has been received from the computing device or that the berry impact recording device 100 has been wirelessly connected to the computing device (e.g., due to BLUETOOTH pairing between the berry impact recording device 100 and the computing device).

For example, a user may use an application on his or her mobile device (e.g., a smartphone, tablet, etc.) to connect the mobile device to the berry impact recording device 100 via BLUETOOTH or a similar mechanism. The application can be used to configure the berry impact recording device 100, retrieve data from the berry impact recording device 100, or otherwise interact with the berry impact recording device 100.

If a computing device has been connected, then execution proceeds to box 313. If the computing device has not been connected, then the berry impact recording device 100 continues to sleep as described at box 306.

Referring next to box 313, the microcontroller 200 causes the berry impact recording device 100 to enter communication mode. To enter communication mode, the microcontroller 200 may cause the memory 203 to power on, and the microcontroller 200 itself may resume from its previously suspended operation so that the microcontroller 200 can both respond to external interrupts and execute various program instructions. Execution of the previously described process subsequently ends.

Figure 4:
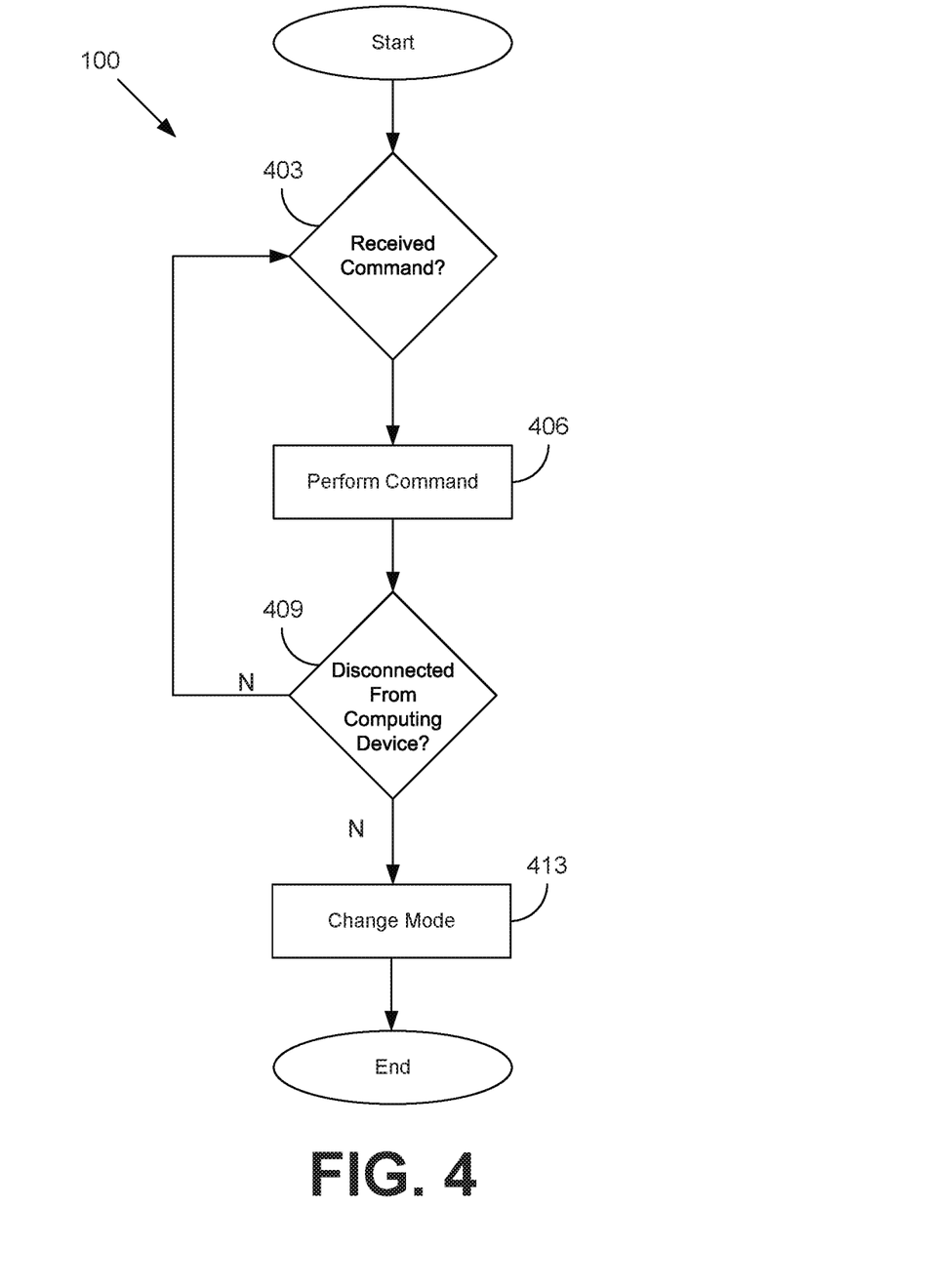
FIG. 4 is a flowchart illustrating one example of functionality implemented within the circuit board of the berry impact recording device depicted in FIG. 1 according to various embodiments of the present disclosure.

Referring next to FIG. 4, shown is a flowchart that provides one example of the operation of a portion of the berry impact recording device 100 while in communication mode according to various embodiments. It is understood that the flowchart of FIG. 4 provides merely an example of the many different types of functional arrangements that may be employed to implement the operation of the portion of the berry impact recording device 100 as described herein. As an alternative, the flowchart of FIG. 4 may be viewed as depicting an example of elements of a method implemented in the berry impact recording device 100 according to one or more embodiments.

Beginning with box 403, the berry impact recording device 100 determines whether a command has been received. For example, the microcontroller 200 (FIG. 2) may data received via the universal serial bus (USB) interface or serial port interface (SPI) on the circuit board 113 (FIG. 1) or via the radio communications interface 119 to determine if a command has been issued to the berry impact recording device. For example, the microcontroller 200 may determine the presence of a specific series of bit values that indicates a "start to sample" command, a "configure sensor" command, or an "upload sensor data to computer" command. If a command has been received, then execution proceeds to box 406. If no command has been received, then the berry impact recording device 100 waits to receive a command.

Moving on to box 406, the microcontroller 200 causes the berry impact recording device 100 to perform the command received. For example, if an "enter sample mode" or similar command is received, the microcontroller 200 will store the values for the frequency at which the sensor 109 (FIG. 1) will sample data and the threshold above which the sensor 109 will record a sample of data. These values may be default values or may be specified through an application executing on the connected computing device. The microcontroller 200 would then cause the berry impact recording device 100 to enter sampling mode after the berry impact recording device 100 has been disconnected from the attached computing device.

Proceeding next to box 409, the berry impact recording device 100 determines whether it has been disconnected from the attached computing device. For example, the USB controller of the microcontroller 200 may detect that the attached computing device has been detached from the USB interface of the circuit board 113 as a result of a signal received from the USB interface by the microcontroller 200. As another example, the microcontroller 200 may determine that a wireless connection between the computing device and the radio communications interface 119 has been terminated (e.g., due to a termination of a BLUETOOTH pairing, due to receipt of an express command from the computing device to terminate the session or connection, or as a result of the microcontroller determining that no messages has been received via the radio communications interface 119 for more than a predefined period of time).

If the berry impact recording device 100 has been disconnected from the attached computing device, then execution proceeds to box 413. If the computing device remains attached to the berry impact recording device 100, then execution proceeds back to box 403 for processing of additional commands.

Referring next to box 413, the berry impact recording device 100 switches to sampling mode or sleep mode, depending on the previous commands received. For example, if an "enter sample mode" or "start sampling" command were received, then the berry impact recording device 100 would enter sampling mode. However, if only commands related to retrieving data from berry impact recording device 100 were received, then the berry impact recording device 100 may return to sleep mode. After changing to sleep mode or sampling mode, execution of the previously described process subsequently ends.

Figure 5:
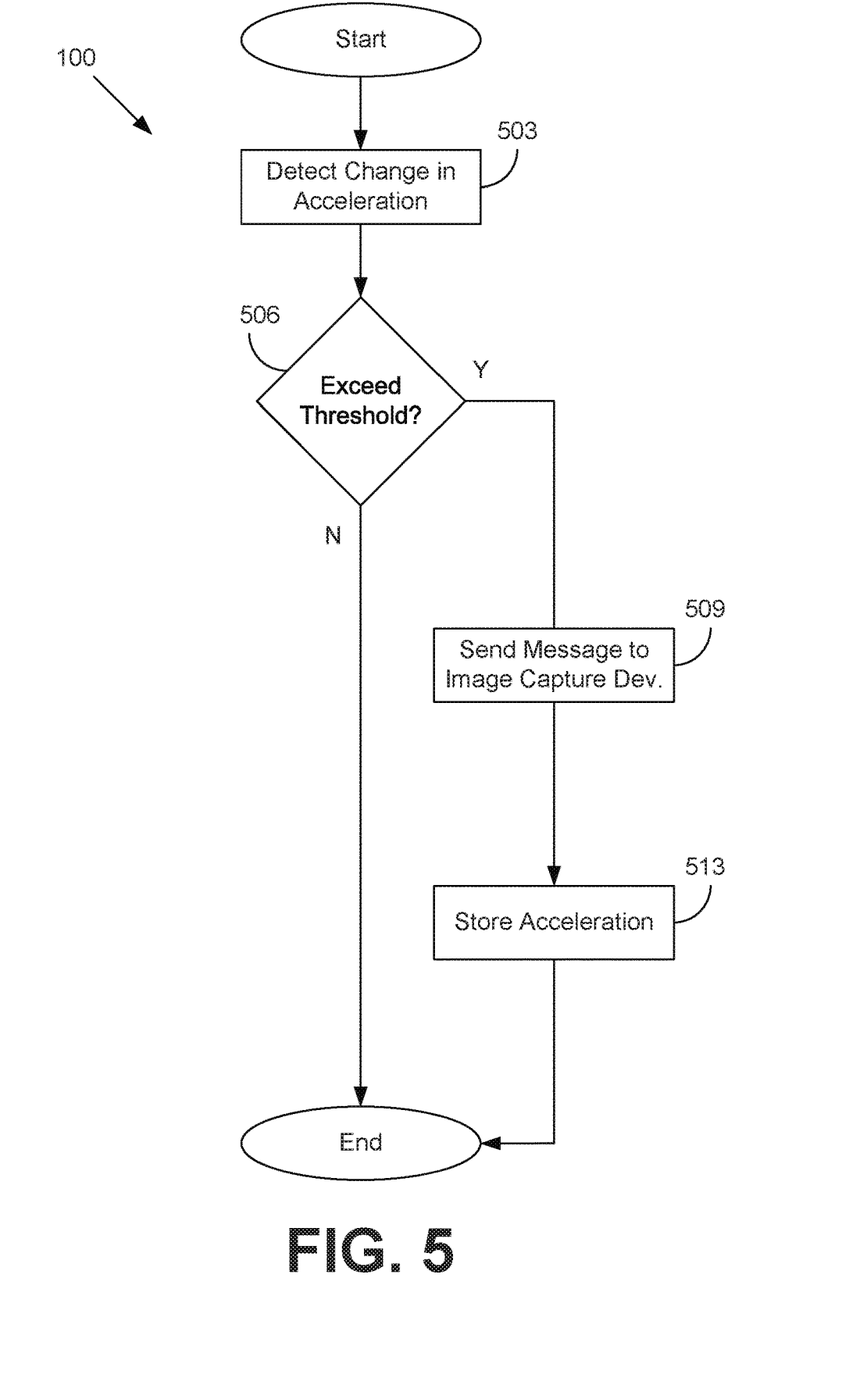
FIG. 5 is a flowchart illustrating one example of functionality implemented within the circuit board of the berry impact recording device depicted in FIG. 1 according to various embodiments of the present disclosure.

Referring next to FIG. 5, shown is a flowchart that provides one example of the operation of a portion of the berry impact recording device 100 while in sampling mode according to various embodiments. It is understood that the flowchart of FIG. 5 provides merely an example of the many different types of functional arrangements that may be employed to implement the operation of the portion of the berry impact recording device 100 as described herein. As an alternative, the flowchart of FIG. 5 may be viewed as depicting an example of elements of a method implemented in the berry impact recording device 100 according to one or more embodiments.

Beginning with box 503, the sensor 109 (FIG. 1) registers a change in the acceleration of the berry impact recording device 100. The change in acceleration may be detected along one or more axes of movement, such as the X-axis, Y-axis, and/or Z-axis.

Proceeding to box 506, the microcontroller 200 (FIG. 2) determines whether the magnitude of the change in the acceleration of the berry impact recording device 100 exceeds a predefined threshold value. By setting a minimum threshold value, the berry impact recording device 100 is able to disregard the general jostling that occurs during mechanical harvesting and/or processing of berries, but still record data related to impact events that would bruise or otherwise damage berries during mechanical harvesting and/or processing. If the magnitude of the change in the acceleration of the berry impact recording device 100 exceeds the predefined threshold, then execution proceeds to box 509. Otherwise execution ends.

Moving to box 509, the microcontroller 200 sends a message or command to an image capture device (e.g., a photographic camera or a video camera) in network communication or otherwise communicatively coupled with the berry impact recording device 100. The message or command, when received by the image capture device, causes the image capture device to capture an image (e.g., capture a photograph or a short video). Assuming that the lens of the image capture device is aimed towards the location where the berry impact recording device 100 is located when the change in acceleration detected at step 503 occurs, the event that causes the change in acceleration may be recorded for further analysis.

Referring next to box 513, the microcontroller 200 writes the change in acceleration detected by the sensor in box 503 to memory 203 (FIG. 2). The data may be compressed and/or written to the memory 203 using a 64-bit word or, for 32-bit architectures, as a pair of 32-bit words. For example, in some embodiments, the data may be written such that 2 bits are used to describe the type of impact experience by the sensor 109, the acceleration is described using 30 bits, with 10 bits each to store acceleration on the X-axis, Y-axis, and Z-axis, and the a 32-bit timestamp is used to identify when the sensor reading occurred. Table 1 below reflects the layout of the data written to memory 203, as may be implemented in various embodiments of the present disclosure.

TABLE 1

Structure of Impact Data Written to Memory.

| Field Name | Impact type Impact type | Acceleration | | | Tick |
| --- | --- | --- | --- | --- | --- |
| | | X axis | Y axis | Z axis | Tick |
| Bits | 2 | 10 | 10 | 10 | 32 |
| Description | 1, 2: impact data | Acceleration of X axis | Acceleration of X axis | Acceleration of X axis | 1 tick |

In some instances, the current position of the berry impact recording device 100 may be stored in the memory 203 in association with the acceleration data. For example, the current location of the berry impact recording device 100 may be retrieved from the geolocation circuit 123 (FIG. 1) and linked to the acceleration data.

Figure 6:
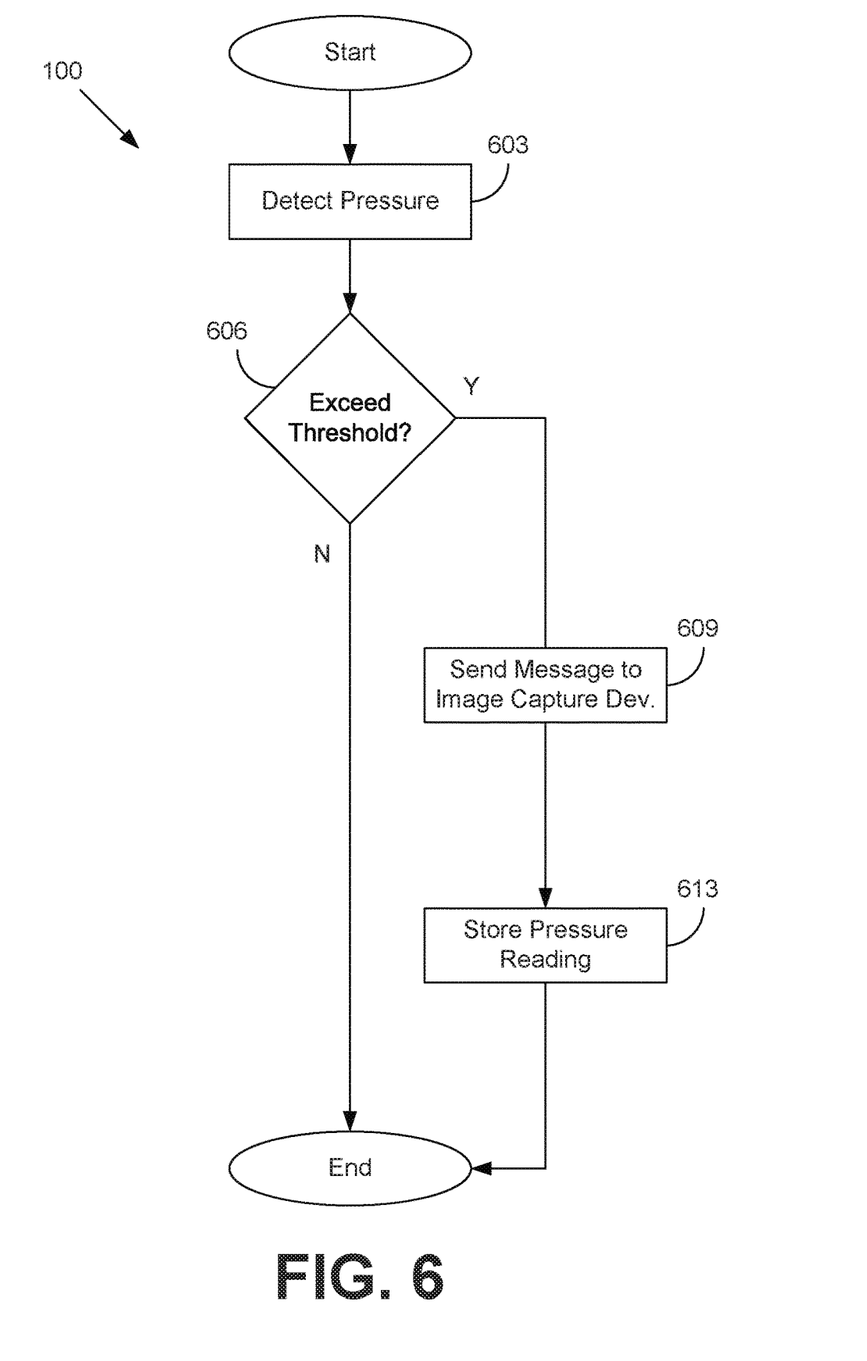
FIG. 6 is a flowchart illustrating one example of functionality implemented within the circuit board of the berry impact recording device depicted in FIG. 1 according to various embodiments of the present disclosure.

Referring next to FIG. 6, shown is a flowchart that provides one example of the operation of a portion of the berry impact recording device 100 while in sampling mode according to various embodiments. It is understood that the flowchart of FIG. 6 provides merely an example of the many different types of functional arrangements that may be employed to implement the operation of the portion of the berry impact recording device 100 as described herein. As an alternative, the flowchart of FIG. 6 may be viewed as depicting an example of elements of a method implemented in the berry impact recording device 100 according to one or more embodiments.

Beginning with box 603, the sensor 109 (FIG. 1) registers a pressure exerted on the exterior shell 103 (FIG. 1) of the berry impact recording device 100. The pressure may be detected due to a temporary deformity of the exterior shell 103, as a weight pressed against the sensor 109, or through other approaches.

Proceeding to box 606, the microcontroller 200 (FIG. 2) determines whether the magnitude of the pressure exerted on the berry impact recording device 100 exceeds a predefined threshold value. By setting a minimum threshold value, the berry impact recording device 100 can disregard the general jostling that occurs during mechanical harvesting and/or processing of berries, but still record data related to impact events that would bruise or otherwise damage berries during mechanical harvesting and/or processing. If the magnitude of the pressure exerted on the berry impact recording device 100 exceeds the predefined threshold, then execution proceeds to box 609. Otherwise execution ends.

Moving to box 609, the microcontroller 200 sends a message or command to an image capture device (e.g., a photographic camera or a video camera) in network communication or otherwise communicatively coupled with the berry impact recording device 100. The message or command, when received by the image capture device, causes the image capture device to capture an image (e.g., capture a photograph or a short video). Assuming that the lens of the image capture device is aimed towards the location where the berry impact recording device 100 is located when the pressure detected at step 603 occurs, the event that causes the pressure may be recorded for further analysis.

Referring next to box 613, the microcontroller 200 writes data related to the pressure detected by the sensor in box 603 to memory 203 (FIG. 2). The data may be compressed and/or written to the memory 203. The data recorded may include a timestamp to reflect when the pressure was detected, a value representing the magnitude of the pressure, as well as other relevant data. In some instances, the current position of the berry impact recording device 100 may be stored in the memory 203 in association with the pressure data. For example, the current location of the berry impact recording device 100 may be retrieved from the geolocation circuit 123 (FIG. 1) and linked to the pressure data record.

The flowcharts of FIGS. 3, 4, 5, and 6 show the functionality and operation of an implementation of portions of the berry impact recording device 100. If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as the microcontroller 200. The machine code may be converted from the source code, etc. If embodied in hardware, each block may represent a circuit or a number of interconnected circuits to implement the specified logical function(s).

Although the flowcharts of FIGS. 3, 4, 5, and 6 show a specific order of execution, it is understood that the order of execution may differ from that which is depicted. For example, the order of execution of two or more blocks may be scrambled relative to the order shown. Also, two or more blocks shown in succession in FIGS. 3, 4, 5, and 6 may be executed concurrently or with partial concurrence. Further, in some embodiments, one or more of the blocks shown in FIGS. 3, 4, 5, and 6 may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein that comprises software or code can be embodied in any non-transitory computer-readable medium for use by or in connection with an instruction execution system such as, for example, a microcontroller 200, a processor in a computer, or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system.

The computer-readable medium can comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

Further, any logic or application described herein may be implemented and structured in a variety of ways. For example, one or more applications described may be implemented as modules or components of a single application. Further, one or more applications described herein may be executed in shared or separate computing devices or a combination thereof. Additionally, it is understood that terms such as "application," "service," "system," "engine," "module," and so on may be interchangeable and are not intended to be limiting.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, the following is claimed:

1. A berry impact recording device, comprising:
 a waterproof shell;
 a battery located within the waterproof shell;
 an inductor located within the waterproof shell and electrically coupled to the battery;
 a sensor located within the waterproof shell, wherein the sensor is configured to at least:
  detect an acceleration of the berry impact recording device;
  report the acceleration of the berry impact recording device to an integrated circuit within the waterproof shell;
  detect a pressure applied to the berry impact recording device; and
  report the pressure applied to the berry impact recording device to the integrated circuit; and
 wherein the integrated circuit is configured to at least:
  record the acceleration of the berry impact recording device and a timestamp corresponding to when the acceleration was reported or detected; and
  record the pressure applied to the berry impact recording device and a timestamp corresponding to when the pressure was reported or detected.

2. The berry impact recording device of claim 1, wherein the waterproof shell comprises a shape of a berry and at least one dimension of the berry.

3. The berry impact recording device of claim 1, wherein the integrated circuit is further configured to at least:
 determine that a magnitude of the acceleration exceeds a predefined threshold; and
 record the acceleration and the timestamp in response to a determination that the magnitude of the acceleration exceeds the predefined threshold.

4. The berry impact recording device of claim 1, further comprising a charge controller configured to convert an alternating current voltage generated by the inductor to a direct current voltage to charge the battery.

5. The berry impact recording device of claim 4, further comprising a radio communications interface located within the waterproof shell, the radio communications interface being communicatively coupled with the integrated circuit.

6. The berry impact recording device of claim 5, further comprising a geolocation circuit, wherein the integrated circuit is further configured to:
retrieve, from the geolocation circuit, a current location of the berry impact recording device; and
transmit, via the radio communications interface, the current location of the berry impact recording device to a remote computing device in network communication with the berry impact recording device.

7. The berry impact recording device of claim 5, wherein the integrated circuit is further configured to transmit in real time via the radio communications interface at least one of:
the acceleration of the berry impact recording device and the timestamp corresponding to when the acceleration was reported or detected; or
the pressure applied to the berry impact recording device and the timestamp corresponding to when the pressure was reported or detected.

8. The berry impact recording device of claim 5, wherein the integrated circuit is further configured to send a command, via the radio communications interface and in response to receipt of a first report of the acceleration or the second report of the pressure, to a remote image capture device, the command causing the remote image capture device to capture an image of the berry impact recording device.

9. An apparatus, comprising:
a waterproof shell;
a battery located within the waterproof shell;
tuned resonator located within the waterproof shell and electrically coupled to the battery;
a sensor located within the waterproof shell, wherein the sensor is configured to at least detect an acceleration of the apparatus and report the acceleration of the apparatus; and
at least one integrated circuit within the waterproof shell, wherein the integrated circuit is configured to at least:
record the acceleration of the apparatus reported by the sensor and a timestamp corresponding to the reported acceleration of the apparatus.

10. The apparatus of claim 9, wherein the sensor comprises a first sensor and the apparatus further comprises:
a second sensor located within the waterproof shell, wherein the second sensor is configured to at least detect a pressure applied to the apparatus and report the pressure applied to the apparatus; and
the at least one integrated circuit is further configured to at least record the pressure applied to the apparatus reported by the sensor and a timestamp corresponding to the reported pressure.

11. The apparatus of claim 9, further comprising a radio communications interface located within the waterproof shell, the radio communications interface being communicatively coupled with the integrated circuit.

12. The apparatus of claim 9, wherein the at least one integrated circuit is further configured to at least:
determine that a magnitude of the acceleration exceeds a predefined threshold; and
record the acceleration and the timestamp in response to a determination that the magnitude of the acceleration exceeds the predefined threshold.

13. The apparatus of claim 9, further comprising a radio communications interface.

14. The apparatus of claim 9, further comprising a geolocation circuit, wherein the at least one integrated circuit is further configured to:
retrieve a current location of the apparatus from the geolocation circuit; and
transmit the current location of the apparatus via the radio communications interface.

15. The apparatus of claim 9, further comprising a charge controller electrically coupled between the charge circuit and the battery, wherein the charge controller converts an alternating current generated by the charge circuit to a direct current to recharge the battery.

16. A system, comprising:
a waterproof shell comprising a diameter not greater than a three-quarters of an inch, the waterproof shell lacking any breaches in an exterior surface of the waterproof shell;
a circuit board within the waterproof shell and comprising:
a geolocation circuit;
a radio communications interface; and
a microcontroller;
a sensor within the waterproof shell, the sensor being communicatively coupled to the microcontroller;
a battery located within the waterproof shell, the battery being electrically coupled to the circuit board and the sensor;
a charge controller located within the waterproof shell, the charge controller being electrically coupled to the battery; and
an inductor or a tuned resonator located within the waterproof shell, the inductor or the tuned resonator being electrically coupled to the charge controller.

17. The system of claim 16, wherein the radio communications interface comprises a cellular network interface.

18. The system of claim 16, wherein the radio communications interface comprises a network interface that complies with a version of the BLUETOOTH communications protocol.

19. The system of claim 16, wherein the microcontroller is configured to record a timestamp associated with a reading from the sensor and a location at of the system at which the reading occurred.

20. The system of claim 16, wherein a current location of the system is determinable based at least in part on a transmission from the radio communications interface.

* * * * *